United States Patent [19]

Liu et al.

[11] Patent Number: 4,794,444
[45] Date of Patent: Dec. 27, 1988

[54] OHMIC CONTACT AND METHOD FOR MAKING SAME

[75] Inventors: Shing-Gong Liu, Princeton; John P. Paczkowski, Kingston, both of N.J.

[73] Assignee: General Electric Company, Schenectady, N.Y.

[21] Appl. No.: 850,163

[22] Filed: Apr. 10, 1986

[51] Int. Cl.$^4$ ............... H01L 29/161; H01L 29/167; H01L 23/48
[52] U.S. Cl. ...................... 357/65; 357/16; 357/61; 357/63; 357/68; 357/71
[58] Field of Search ............... 357/16, 61, 71, 68, 357/63, 65

[56] References Cited

U.S. PATENT DOCUMENTS

| | | | |
|---|---|---|---|
| 3,984,261 | 10/1976 | Hawrylo | 357/71 |
| 4,398,963 | 11/1980 | Stall et al. | 148/1.5 |
| 4,454,528 | 1/1983 | Trueblood | 357/40 |
| 4,558,336 | 12/1985 | Chang et al. | 357/16 |
| 4,583,110 | 4/1986 | Jackson et al. | 357/63 |

OTHER PUBLICATIONS

"Dependence of Critical Layer Thickness on Strain for $In_xGa_{1-x}As/GaAs$", I. J. Fritz et al., Appl. Phys. Lett., vol. 46, No. 10, May 15, 1985, pp. 967–969.

"Ultra Low Resistance Ohmic Contacts to n-GaAs", R. Stall et al., Electronics Letters, vol. 15, No. 24, Nov. 22, 1979, pp. 800–801.

"Defects in Epitaxial Multilayers", J. W. Matthews et al., J. of Crystal Growth, vol. 27 (1974), pp. 118–125.

Woodall et al., "GaAs Metallization Some Problems and Trends", pp. 794 to 798, J. Vac. Sci. Technol. 19(3), Sep./Oct. 1981.

Woodall et al., "Ohmic Contacts to n-GaAs... Molecular Beam Epitaxy", pp. 626 to 627, J. Vac. Sci. Technol., 19(3), Sep./Oct. 1981.

Primary Examiner—J. Carroll
Assistant Examiner—Ngan Van Ngo
Attorney, Agent, or Firm—Henry I. Steckler; James C. Davis, Jr.; Paul R. Webb, II

[57] ABSTRACT

An Ohmic contact to a semiconductor body includes a thin semiconductor layer disposed between the body and a conductive layer. The thin layer is not alloyed to the conductive layer and not lattice matched to the body. The layer can have a thickness of less than about 100 nm and a lattice mismatch of at least 0.5 percent. Since the thin layer is not alloyed, a Schottky contact can be formed at the same time as the ohmic contact.

14 Claims, 1 Drawing Sheet

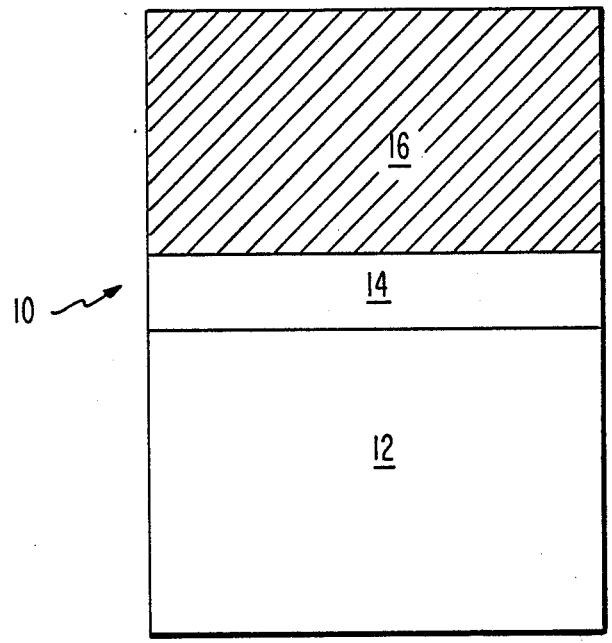

OHMIC CONTACT AND METHOD FOR MAKING SAME

BACKGROUND OF THE INVENTION

The present invention relates to an ohmic contact to a semiconductor body and a method for making same, and more particularly to such a contact for use with a compound semiconductor material such as GaAs or AlGaAs.

Various structures have been used to form an ohmic contact to a semiconductor body. One contact includes a conductive layer, such as a metal, disposed on a very heavily doped region of the semiconductor body. However, reproducible contact resistances are not obtained when the semiconductor body is composed of a Group III-V alloy, and further, the heavily doped region can degrade the surface morphology and crystal quality and therefore adversely effect the underlying active regions of the semiconductor. Another ohmic contact structure is formed by sintering a conductive layer, such as a Au:Ge alloy, with a III-V semiconductor body. However, the sintering step is expensive due to the required handling. Further, if the device also includes Schottky contact, a different metal and extra processing steps are normally required to form the Schottky contact. Another type of ohmic contact includes a lattice matched intermediate semiconductor layer between the conductive layer and the semiconductor body. However, the lattice matching is not always easily achieved and even then will be correct only for a body of one material. Yet another ohmic structure includes a conductive layer overlying two intermediate semiconductor layers. The lower intermediate semiconductor layer is epitaxially formed on the substrate and has a graded composition to be lattice matched to both the substrate and the upper semiconductor layer. However, control of the graduation is tedious and difficult to achieve in practice.

It is, therefore, desirable to have an ohmic contact and a method for making same that is consistent, does not affect active regions, is easy and inexpensive to make, can contact more than one type of semiconductor body, and allows the simultaneous formation of Schottky contacts.

SUMMARY OF THE INVENTION

An ohmic contact structure to a semiconductor body in accordance with the invention comprises a thin semiconductor first layer overlying said substrate and lattice mismatched therewith; and a conductive second layer overlying said first layer and non-alloyed therewith.

A method in accordance with the invention for making an ohmic contact to a semiconductor body comprises forming a lattice mismatched thin semiconductor first layer overlying the body; and forming a conductive non-alloyed second layer overlying said first layer.

BRIEF DESCRIPTION OF THE DRAWING

The sole FIGURE is a cross-sectional view of an ohmic contact in accordance with the invention.

DETAILED DESCRIPTION OF THE PREFERRED EMBODIMENTS

The sole FIGURE shows an ohmic contact 10 comprising a semiconductor body 12, a thin semiconductor first layer 14 overlying the body 12, and a conductive second layer 16 overlying the firs layer 14.

The body 12 can comprise a doped compound semiconductor material, in particular a Group III-V alloy, such as GaAs or AlGaAs. The first layer 14 can comprise a low bandgap semiconductor material, such as $Ga_{0.47}In_{0.53}As$, that is lattice mismatched to the substrate 12 and has N conductivity type doping with a dopant density of $10^{18}$ cm$^{-3}$. Other ratios of Ga and In can be used for the first layer 14 as well as other semiconductor materials. In particular, when the substrate 12 comprises GaAs and the first layer 14 comprises $Ga_{0.47}In_{0.53}As$, the degree of mismatch is about 3.7 percent. In general, by "lattice mismatch" is meant a mismatch of about 0.5 percent or greater. For InAs it is believed that the lattice mismatch is about 7 percent. Thicknesses of the first layer 14 between about 3 and 5 nanometers (nm) have been found to provide good ohmic contacts; however, it is believed that thickness of less than 100 nm, preferably less than 10 nm, will also provide an ohmic contact depending upon the composition of the first and second layers 12 and 14. In general, the higher the lattice mismatch the thinner the first layer 14 should be. The second layer 16 is an electrical conductor and may comprise, for example, an Au:Ge alloy, a Ni layer, and an Au layer sequentially overlying the first layer 14. The second layer 16 is non-alloyed with the first layer 14. By "non-alloyed" is meant that no deliberate sintering step is performed after the formation of the second layer 16. It is to be understood that some minute amount of alloying occurs merely from the physical contacting of the first and second layers 14 and 16.

In operation, it is believed that a thin layer, such as the first layer 14, takes up the lattice mismatch entirely by elastic strains without formation of misfit dislocations, see I. J. Fritz et al., "Dependence of Critical Layer Thickness on Strain for $In_xGa_{1-x}As/GaAs$ Strained-Layer Superlattices", Appl. Phys. Lett., Vol. 46, No. 10, May 15, 1985, pp. 967-969. This lowers the contact resistance so that an ohmic contact is formed. Further, some tunneling occurs through the thin highly doped first layer 14, which reduces the contact resistance still further.

In order to make the contact 10, the body 12 is preheated in a vapor phase epitaxial reactor to about 700° C. for about 3 to 5 minutes. Thereafter, the $Ga_{0.47}In_{0.53}As$ is deposited to form the first layer 14 having a thickness between about 3 and 5 nm. Alternately, the first layer 14 can be deposited by molecular beam expitaxy. Then the second layer 16 is deposited using a known technique such as sputtering or vacuum evaporation.

Desirably, a dielectric layer, such as $SiO_2$, can be deposited on the body 12 and openings for the ohmic contacts defined therein. Then, before deposition of the second layer 16, openings for the Schottky contacts are defined. As a result, the second layer 16 and the Schottky contacts can be formed at the same time using the same conductive material, such as sequentially deposited layers of Ti, Pt, and Au.

EXAMPLE

A thin first layer 14 of $Ga_{0.47}In_{0.53}As$ having a doping level of $10^{18}$ cm$^{-3}$ and without sintering was overlayed on a GaAs body 12. Then a metallic second 16 was overlayed on the first layer 14. An ohmic contact resistivity of about $10^{-6}$ ohm-cm$^2$ was obtained. In general, a contact resistivity of not more than about $10^{-5}$ ohm-cm$^2$ is considered adequate. Thus the ohmic contact of the invention exceeds this requirement by a factor of about 10.

COUNTER EXAMPLE NO. 1

In contradistinction, a contact was formed which was the same as in the example above except that there was no thin first layer 14 present. It exhibited about 5 volt thresholds in both directions before current would flow, i.e. contact resistivity between the threshold voltages was essentially infinite, and therefore the contact was not an ohmic contact.

COUNTER EXAMPLE NO. 2

The non-ohmic contact given in Counter Example No. 1 above was then sintered at 450° C. in forming gas for 1 minute. The result was that there were no threshold voltages present, i.e. the contact was now ohmic and had a contact resistivity of about $10^{-6}$ ohm-cm$^2$.

Thus the present invention provides a non-sintered or non-alloyed contact that has about as low a resistivity as a sintered or alloyed contact.

Although the present invention has been described with respect to Group III-V compound semiconductors, it will be appreciated that it can also be used with Group II-VI semiconductor materials. The invention may also be useful with elemental semiconductor substrates.

What is claimed is:

1. An ohmic contact to a semiconductor body comprising:
    a semiconductor first layer having a thickness of less than about 10 nm and a doping level of at least about $10^{18}$ cm$^{-3}$ and overlying said body and lattice mismatched with respect to the body; and
    a conductive second layer overlying said first layer and non-alloyed with said first layer.
2. The contact of claim 1 wherein said body comprises a compound semiconductor material.
3. The contact of claim 2 wherein said body comprises a Group III-V semiconductor material.
4. The contact of claim 3 wherein said body comprises GaAs.
5. The contact of claim wherein said body comprises AlGaAs.
6. The contact of claim 1 wherein said first layer comprises a compound semiconductor.
7. The contact of claim 6 wherein said first layer comprises a Group III-V semiconductor material.
8. The contact of claim 7 wherein said first layer comprises $Ga_xIn_{1-x}As$, wherein x is greater than 0 and less than 1.
9. The contact of claim 8 wherein x=0.47.
10. The contact of claim 1 wherein said first layer is between about 3 and 5 nm thick.
11. The contact of claim 1 wherein said body is doped.
12. The contact of claim 1 wherein said mismatch is at least 0.5 percent.
13. The contact of claim 12 wherein said mismatch is at least 2 percent.
14. The contact of claim 12 wherein said mismatch is not greater than about 7 percent.

* * * * *